United States Patent
Ando et al.

(10) Patent No.: US 10,593,729 B2
(45) Date of Patent: Mar. 17, 2020

(54) VERTICAL ARRAY OF RESISTIVE SWITCHING DEVICES HAVING RESTRICTED FILAMENT REGIONS AND TUNABLE TOP ELECTRODE VOLUME

(71) Applicant: International Business Machines Corporation, Armonk, NY (US)

(72) Inventors: Takashi Ando, Tuckahoe, NY (US); Robert L. Bruce, White Plains, NY (US); Hiroyuki Miyazoe, White Plains, NY (US); John Rozen, Hastings on Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/003,614

(22) Filed: Jun. 8, 2018

(65) Prior Publication Data
US 2019/0378876 A1     Dec. 12, 2019

(51) Int. Cl.
*H01L 27/24*     (2006.01)
*H01L 45/00*     (2006.01)

(52) U.S. Cl.
CPC ........ *H01L 27/249* (2013.01); *H01L 45/1266* (2013.01); *H01L 45/08* (2013.01); *H01L 45/1226* (2013.01); *H01L 45/1616* (2013.01); *H01L 45/1675* (2013.01); *H01L 45/1683* (2013.01)

(58) Field of Classification Search
None
See application file for complete search history.

(56) References Cited

U.S. PATENT DOCUMENTS

| | | | |
|---|---|---|---|
| 7,800,094 B2 | 9/2010 | Ho et al. | |
| 8,144,498 B2 | 3/2012 | Kumar et al. | |
| 8,362,457 B2 * | 1/2013 | Kim ................... | G11C 13/0007 257/4 |
| 8,492,742 B2 | 7/2013 | Tamai | |
| 8,614,148 B2 | 12/2013 | Park et al. | |
| 8,766,228 B2 | 7/2014 | Yang et al. | |
| 8,846,484 B2 | 9/2014 | Lee et al. | |
| 8,980,766 B2 | 3/2015 | Wang et al. | |
| 9,184,378 B2 | 11/2015 | Choi et al. | |
| 9,331,275 B2 | 5/2016 | Sandhu | |
| 9,419,053 B2 | 8/2016 | Hsu | |

(Continued)

OTHER PUBLICATIONS

Definition of pillar downloaded from URL< https://www.merriam-webster.com/dictionary/pillar> on Apr. 29, 2019 (Year: 2019).*

(Continued)

*Primary Examiner* — J. E. Schoenholtz
(74) *Attorney, Agent, or Firm* — Cantor Colburn LLP; Vazken Alexanian

(57) ABSTRACT

Embodiments of the invention are directed to a vertical resistive device. A non-limiting example of the vertical resistive device includes a horizontal plate having a conductive electrode region and a filament region. An opening extends through the filament region and is defined by sidewalls of the filament such that the filament region is positioned outside of the opening. A conductive pillar is positioned within the opening and is communicatively coupled to the filament region.

14 Claims, 8 Drawing Sheets

(56) References Cited

U.S. PATENT DOCUMENTS

| | | | |
|---|---|---|---|
| 9,985,206 B1 | 5/2018 | Ando et al. | |
| 2012/0319072 A1* | 12/2012 | Wei | H01L 45/08 257/4 |
| 2013/0210193 A1 | 8/2013 | Lee et al. | |
| 2014/0319443 A1 | 10/2014 | Wang et al. | |
| 2015/0016178 A1 | 1/2015 | Nardi et al. | |
| 2015/0021537 A1 | 1/2015 | Xie et al. | |
| 2015/0188044 A1 | 7/2015 | Wang et al. | |
| 2015/0255512 A1* | 9/2015 | Takagi | H01L 45/146 257/4 |
| 2017/0005137 A1* | 1/2017 | Kim | H01L 27/11514 |
| 2017/0256588 A1* | 9/2017 | Fukuda | H01L 27/2481 |
| 2017/0263681 A1* | 9/2017 | Toriyama | H01L 27/249 |

OTHER PUBLICATIONS

Marinella, M.J., "3D Monolithic Resistive RAM", IEEE S3S Conference, Rohnert Park CA Oct. 5, 2015. (Year: 2015).*

Schonhals, A., et al. "3-Bit Read Scheme for Single Layer Ta2O5 ReRAM." 2014 14th Annual Non-Volatile Memory Technology Symposium (NVMTS), 2014, doi:10.1109/nvmts.2014.7060845 (Year: 2014).*

Park, Seong-Geon, et al. "A Non-Linear ReRAM Cell with Sub-1μA Ultralow Operating Current for High Density Vertical Resistive Memory (VRRAM)." 2012 International Electron Devices Meeting, 2012, doi:10.1109/iedm.2012.6479084. (Year: 2012).*

Ando et al., "Resistive Switching Memory Stack for Three-Dimensional Structure," U.S. Appl. No. 15/868,506, filed Jan. 11, 2018.

Baek et al., "Realization of Vertical Resistive Memory (VRRAM) using cost effective 3D Process," 2011 IEEE International Electron Devices Meeting (IEDM), IEEE, 2011, 31.8, 4 pages.

Electronic Materials Research Laboratory, "Redox-based Tera-bit memories," http://www.emrl.de/r_a_1.html (retrieved Jan. 3, 2018), 10 pages.

List of IBM Patents or Patent Applications Treated as Related; Date Filed: Jun. 8, 2018, 2 pages.

Nauenheim et al., "Integration of TiO2 into Nano-Crossbar Arrays with 100 nm Half Pitch for Resisitve RAM Applications," Institute of Solid State Research, Scientific Report 2007, pp. 196-197.

Wong et al., "Metal—Oxide RRAM," Proceedings of the IEEE, vol. 100, No. 6, Jun. 2012, pp. 1951-1970.

* cited by examiner

| RESISTIVITY (OHM METERS) | RESISTIVITY TYPE | EXAMPLE MATERIALS |
|---|---|---|
| $\rho < 10^6$ | LOW RESISTIVITY | METALS AND ALLOYS |
| $\rho = 10^6$ TO $10^9$ | MEDIUM RESISTIVITY | SOME ORGANIC POWDERS, CONCRETE, WOOD |
| $\rho < 10^9$ | HIGH RESISTIVITY | SYNTHETIC POLYMERS |

FIG. 12

VERTICAL ARRAY OF RESISTIVE SWITCHING DEVICES HAVING RESTRICTED FILAMENT REGIONS AND TUNABLE TOP ELECTRODE VOLUME

BACKGROUND

The present invention relates in general to an array of resistive switching devices (RSDs). More specifically, the present invention relates to fabrication methods and resulting structures for forming a vertical array of RSDs having restricted filament regions and tunable top electrode volume.

Resistive random access memory (ReRAM) is a nanoscale non-volatile memory (NVM). ReRAM provides simple storage cell components, high density, low power, large endurance, fast write/read/erase speeds, and excellent scalability. A typical ReRAM storage cell is two-terminal device formed as a metal-insulator-metal (MIM) structure. The insulator material can be a binary metal oxide, which makes the MIM storage cell compatible with silicon-based CMOS (complementary metal oxide semiconductor) fabrication process. When a sufficient electrical signal is applied across the metal electrodes of a MIM, the resistance of the insulator can be switched from one resistance state to another. The insulator retains its current resistance state until an appropriate electrical signal is applied across the metal electrodes to change it.

ReRAM, along with the logic circuitry used to address/read/write individual ReRAM cells, can be implemented in an array (e.g., crossbar arrays), which is compatible with a variety of electronic circuits and devices, including neuromorphic architectures. Multiple pre-neurons and post-neurons can be connected through the array of ReRAMs, which naturally expresses a fully-connected neural network. The density of ReRAM can be increased by configuring the array as a three-dimensional (3D) vertical stack of addressable ReRAM cells as practiced in Flash NAND technologies.

SUMMARY

Embodiments of the invention are directed to a vertical resistive device. A non-limiting example of the vertical resistive device includes a horizontal plate having a conductive electrode region and a filament region. An opening extends through the filament region and is defined by sidewalls of the filament such that the filament region is positioned outside of the opening. A conductive pillar is positioned within the opening and is communicatively coupled to the filament region.

Embodiments of the invention are directed to a method of forming a vertical resistive device. A non-limiting example of the method includes forming a stack that includes a horizontal plate having a conductive electrode region and a filament region. The stack further includes an opening that extends through the filament region and is defined by sidewalls of the filament such that the filament region is positioned outside of the opening. The stack further includes a conductive pillar positioned within the opening and communicatively coupled to the filament region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 5-11 illustrate cross-sectional views depicting the results of various fabrication operations in accordance with embodiments of the invention for forming the RSDs of the vertical ReRAM array shown in FIG. 4, in which:

FIG. 5 depicts a cross-sectional view of a segment of the vertical ReRAM array after fabrication operations according to aspects of the invention;

FIG. 6 depicts a cross-sectional view of a segment of the vertical ReRAM array after fabrication operations according to aspects of the invention;

FIG. 7 depicts a cross-sectional view of a segment of the vertical ReRAM array after fabrication operations according to aspects of the invention;

FIG. 8 depicts a cross-sectional view of a segment of the vertical ReRAM array after fabrication operations according to aspects of the invention;

FIG. 9 depicts a cross-sectional view of a segment of the vertical ReRAM array after fabrication operations according to aspects of the invention;

FIG. 10 depicts a cross-sectional view of a segment of the vertical ReRAM array after fabrication operations according to aspects of the invention;

FIG. 11 depicts a cross-sectional view of a segment of the vertical ReRAM array after fabrication operations according to aspects of the invention; and FIG. 12 depicts a table showing example ranges and material types for low resistivity, medium resistivity, and high resistivity according to aspects of the present invention.

DETAILED DESCRIPTION

Figure 1A:
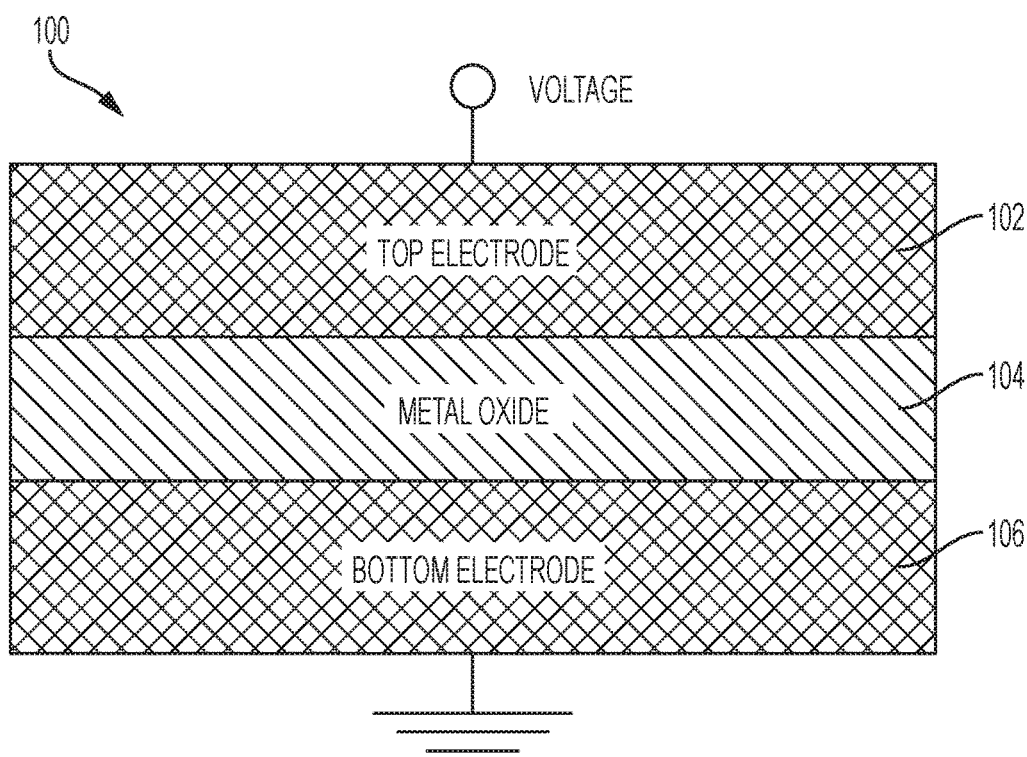
FIG. 1A depicts a simplified block diagram illustrating a cross-sectional view of a two-terminal resistive switching device (RSD), which can be used as a storage cell of an ReRAM structure capable of incorporating aspects of the invention.

It is understood in advance that, although a detailed description is provided of the formation and resulting structures for a specific type of RSD, implementation of the teachings recited herein are not limited to a particular type of RSD or IC architecture. Rather embodiments of the present invention are capable of being implemented in conjunction with any other type of RSD (e.g., phase change memory, spin-transfer torque memory, and the like) or IC architecture (e.g., RAM, neuromorphic computing applications, etc.), now known or later developed.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, with the growth of digital data applications, there is a need for increasingly fast and scalable memory technologies for data storage and data-driven computation. ReRAM is a high speed, high density, and low fabrication-cost NVM technology. Thus, ReRAM has the potential to replace and/or complement the limited scaling of flash memories and other silicon-based memories such as dynamic random access memory (DRAM) and static random access memory (SRAM).

A typical ReRAM storage cell is a two-terminal device formed as a metal-insulator-metal (MIM) structure, which is a simpler construction than the three terminal storage cells used in conventional CMOS-based DRAM or flash memory. The insulator material in the MIM can be a binary metal oxide, which makes fabricating a MIM ReRAM storage cell compatible with silicon-based CMOS fabrication process. The resistance of an ReRAM storage cell serves as the switchable conduction state that stores data. When a sufficient electrical field/signal is applied across the metal electrodes of a MIM, the resistance of the insulator can be switched from one resistance state to another through various mechanisms, including the formation and rupture of one-dimensional conductive filaments formed in the metal oxide during electroforming. The formation and rupture of the conducting filaments involves various reduction-oxidation (redox) reactions and depends on the metal/electrode material. The oxygen vacancy concentration (Vo) in the oxide of the binary metal oxide and the state of the insulator/electrode interface are significant factors in controlling the resistive switching mechanism in a MIM memory cell. Thus, it is desirable to use insulators in the form of oxides with a high mobility of oxygen vacancies (e.g., single-layer nonstoichiometric or double-layer oxide structures with ionic bonding).

Because each ReRAM storage cell uses only two external terminals, these memories can be accommodated in an array (e.g., the crossbar array 200 shown in FIG. 2, and the vertical ReRAM array 300 shown in FIG. 3), which is compatible with a variety of electronic circuits and devices, including ultra-high density NVM and artificial neural network (ANN) architectures. A basic array includes a set of conductive row electrodes and a set of conductive column electrodes formed to intersect the set of conductive row electrodes. The intersections between the two sets of electrode lines are separated by a so-called "cross-point" device, which, in ReRAM memory circuits, can be implemented as a two-terminal MIM RSD. The conduction state (e.g., resistance) of the MIM insulator can be altered by controlling the voltages applied between individual electrode lines of the row and column electrode lines. Digital data can be stored by alteration of the insulator material's conduction state at the intersection to achieve a high conduction state (or low resistance state (LRS)) or a low conduction state (or high resistance state (HRS)). The MIM insulator material can also be programmed to maintain two or more distinct conduction states by selectively setting the conduction state of the material. The conduction state of the memristor material can be read by applying a voltage across the material and measuring the current that passes through the target crosspoint device.

In neuromorphic computing applications (e.g., ANN), an RSD can be used as a connection (synapse) between a pre-neuron and a post-neuron, thus representing the connection weight in the form of device resistance. Neuromorphic systems are interconnected processor elements that act as simulated "neurons" and exchange "messages" between each other in the form of electronic signals. Similar to the so-called "plasticity" of synaptic neurotransmitter connections that carry messages between biological neurons, the connections in neuromorphic systems such as ANNs carry electronic messages between simulated neurons, which are provided with numeric weights that correspond to the strength or weakness of a given connection. The weights can be adjusted and tuned based on experience, making neuromorphic systems adaptive to inputs and capable of learning. For example, a neuromorphic/ANN for handwriting recognition is defined by a set of input neurons, which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read. Multiple pre-neurons and post-neurons can be connected through an array of ReRAMs, which naturally expresses a fully-connected neural network.

The density of MIM ReRAMs in an array can be increased by forming the array as a 3D stack of ReRAM cells as practiced in Flash NAND technology. A vertical ReRAM array (e.g., the vertical ReRAM array 300 shown in FIG. 3) is an example of a 3D array. In a vertical ReRAM, a stack of horizontal plates serves as shared bottom electrodes, and vertical electrodes (e.g., a conductive pillar) extend through an openings/vias in the stack of horizontal plates to serve as shared top electrode. A metal oxide is wrapped around each of the vertical electrodes such that both the metal oxide and the vertical electrode occupy each opening/via in the stacked horizontal plates. An individual ReRAM cell/stack of the vertical ReRAM array is defined at each intersection between a horizontal plate (bottom electrode) and a vertical electrode (top electrode). The metal oxide of each individual ReRAM cell/stack is the portion of the metal oxide that is around the vertical electrode at the horizontal/vertical electrode intersection.

In general, the vertical electrode and metal oxide of a MIM cell/stack (e.g., MIM stack 100 shown in FIG. 1A) can be deposited by physical vapor deposition (PVD) in order to control the oxygen vacancy concentration in the metal oxide layer. However, it is difficult to apply PVD fabrication techniques to 3D structures. Atomic layer deposition (ALD) has been proposed as a method to deposit the metal oxide around the vertical electrode. However, as the opening/via diameter is reduced due to scaling, the resistivity of the vertical electrodes become high due to limited area for metal deposition.

Turning now to an overview of aspects of the present invention, embodiments of the invention address the shortcomings of the prior art by providing fabrication methodologies and resulting structures for forming a vertical array of RSDs having restricted metal oxide (or filament) regions and tunable top electrode volume. In embodiments of the invention, a vertical array of RSDs is provided, and each RSD of the vertical array is formed in a MIM configuration in which a horizontal plate serves as the bottom electrode, and a vertical electrode (e.g., a conductive pillar) extends through an opening/via in the horizontal plate to serve as the top electrode. The vertical electrode includes a reactive electrode region formed from a stack of metal layers, along with a metal fill region formed from a low resistivity metal. In contrast to known MIM configurations, the metal oxide is fabricated in a manner such that it is, in effect, part of the horizontal electrode. Thus, in embodiments of the invention, the horizontal plate includes a conductive electrode region and a metal oxide region, and the opening/via through the horizontal plate extends, in effect, through the metal oxide region of the horizontal plate. Accordingly, unlike known MIM configurations, none of the volume defined by the opening/via through the horizontal plate needs to be allocated to the metal oxide, and all of the volume defined by the opening/via through the horizontal plate can be allocated to the vertical electrode. Although the metal oxide is not present within the opening/volume, embodiments of the invention do not compromise the resistive switching performance of the RSD because a full interface between the conductive electrode portion of the horizontal plate and the metal oxide portion of the horizontal plate is maintained. By maintaining the full electrode/oxide interface, the concentration of oxygen vacancies in the oxide is not compromised.

Because embodiments of the invention, in effect, decouple the metal oxide region from the opening/via volume, an expanded range of RSD parameters can be tuned (and mixed and matched) for optimized RSD performance. The parameters include the size of the interface between the conductive electrode of the horizontal plate and the metal oxide region of the horizontal plate; the volume of the opening/via; the portion of the horizontal plate that is allocated to the conductive electrode; the portion of the horizontal plate that is allocated to the metal region; the thickness of the metal layers that form the reactive electrode portion of the vertical electrode; and the volume of the low resistance metal fill material that forms the metal fill portion of the vertical electrode. For example, for a given opening/via diameter/pitch, more of the opening/via can be allocated to the low resistivity metal fill material, thereby lowering the resistance for the vertical electrode and enabling the formation of larger cell array structures than in the prior art.

In embodiments of the invention, the conductive region of the horizontal plate (i.e., the bottom electrode) can be formed from TiN or W deposited by ALD, chemical vapor deposition (CVD), or PVD. In an ALD application, $HfO_2$ or $Ta_2O_5$ or $ZrO_2$ can be used as base oxides to form the metal oxide region of the horizontal plate. The reactive electrode of the vertical top electrode can be formed by using ALD to form a TiN/(M)AlC/TiN stack, where M is a transition metal such as, but not limited to, Ti, Ta, and Nb. An oxygen vacancy concentration of the vertical top electrode can be controlled by the TiN/(M)AlC thicknesses and Al % in the (M)AlC layer of the vertical top electrode.

As previously noted herein, in embodiments of the invention, the vertical electrode includes a reactive electrode region formed from a stack of metal layers, along with a metal fill region formed from a low resistivity metal. In embodiments of the invention, the metal fill material of the vertical electrode can include one or more low-resistivity metals selected from the group consisting of tungsten (W), aluminum (Al), and copper (Cu). In embodiments of the invention, the reactive electrode region can include a bottom layer, an intermediate layer and a top layer. The bottom layer can be formed from titanium nitride (TiN) having a thickness dimension from about 0.3 nm to about 3.0 nm. The intermediate layer can be formed from (M)AlC, where M is a transition metal selected from the group consisting of titanium (Ti), tantalum (Ta), and Niobium (Nb). The intermediate layer can have a thickness dimension from about 1 nm to about 10 nm. The top layer can be formed from TiN having a thickness dimension from about 1 nm to about 3 nm.

Turning now to a more detailed description of example embodiments of the invention, FIG. 1A depicts a simplified block diagram illustrating a cross-sectional view of a two-terminal RSD component 100, which can be used as a storage cell of an ReRAM structure (e.g., crossbar array 200 shown in FIG. 2 or vertical ReRAM array 300 shown in FIG. 3) capable of incorporating aspects of the invention. The RSD storage cell 100 includes a top electrode 102, metal oxide active region 104, and a bottom electrode 106, configured and arranged as shown. When a sufficient electrical signal (e.g., a voltage) is applied across the top/bottom electrodes 102, 106, the resistance of the metal oxide 104 can be switched from one resistance state to another. The metal oxide 104 retains its current resistance state until an appropriate electrical signal is applied across the top/bottom electrodes 102, 106 to change it.

Figure 1B:
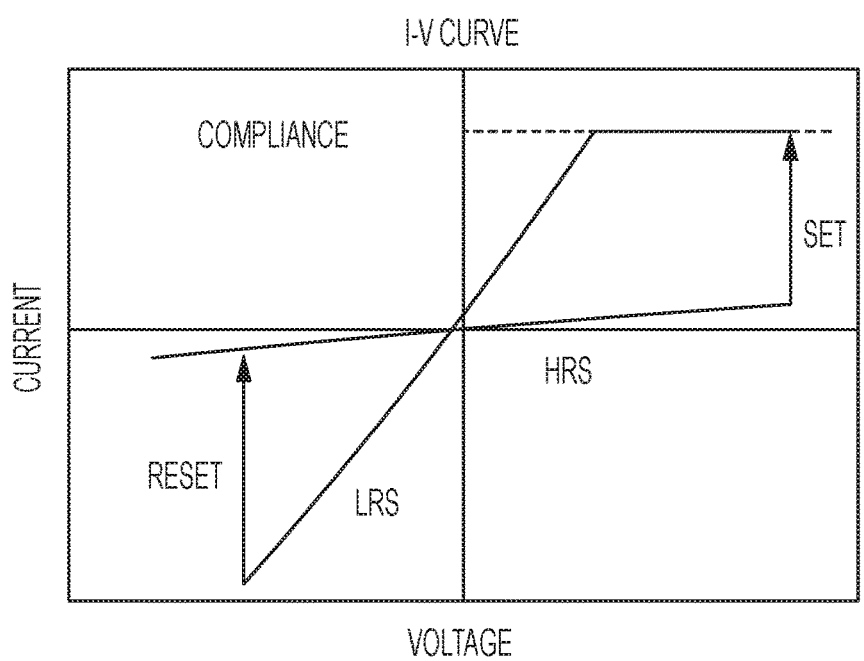
FIG. 1B depicts a diagram of an I-V curve illustrating the switching operation of the RSD component shown in FIG. 1A.

FIG. 1B depicts a diagram of an I-V curve illustrating the switching operation of the RSD storage cell 100. The operation principle of the RSD storage cell 100 is based on the reversible resistive switching (RS) between at least two stable resistance states, namely the high resistance state (HRS) and low resistance state (LRS), which occur in the metal oxide 104. In general, the operation that changes the resistance of the storage cell 100 from a high resistance state (HRS) to a low resistance state (LRS) is called a SET process, while the opposite process is defined as a RESET process. The specific resistance state (HRS or LRS) can be retained after the electric stress is cancelled, which indicates the nonvolatile nature of ReRAM. For an initial write operation, a voltage larger than the SET voltage is needed in order to "turn on" the resistive switching behaviors of the metal oxide 104 for the subsequent cycles. This is often referred to as the forming process or the electroforming process.

Based on the electrical polarity's relationship between the SET process and the RESET processes, the resistive switching behaviors of the storage cell 100 can be divided into two modes, which are known as a unipolar mode (not shown) and a bipolar mode (shown in FIG. 1B). In the unipolar switching mode, both SET and RESET transitions are achieved by applying electrical voltages of the same polarity (e.g., a positive voltage). In the bipolar switching mode, SET and RESET transitions are executed by applying voltages of opposite polarities (e.g., a positive voltage SET and a negative voltage RESET). In both cases, the current is limited by a compliance level during the abrupt set transition in order to suitably control the size of current conducting filament (CF) and the corresponding LRS resistance value.

Figure 2:
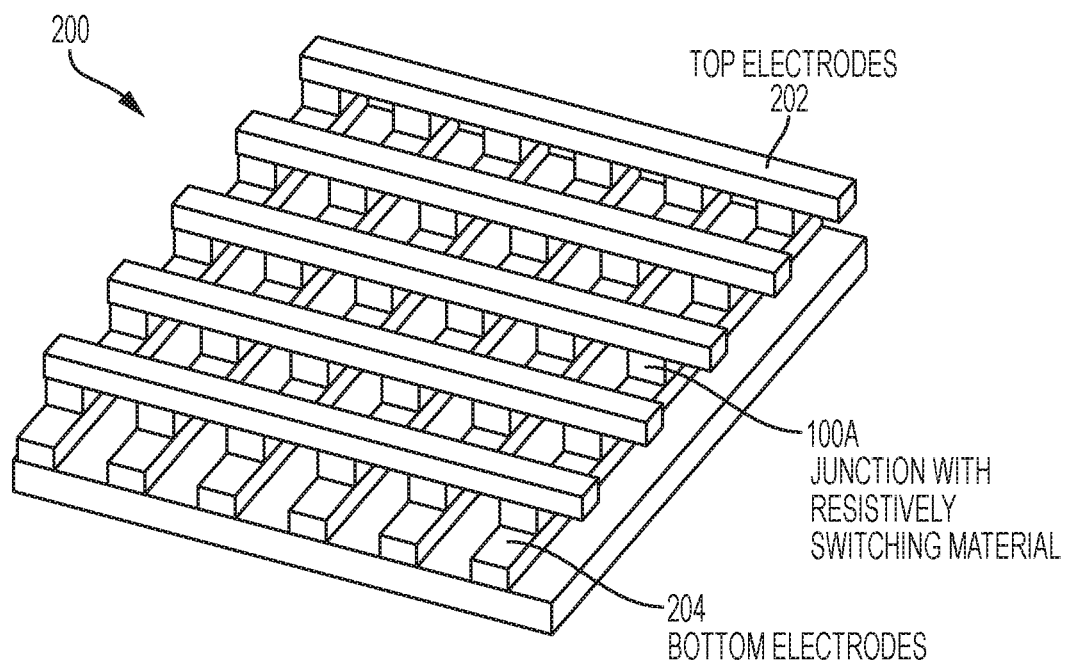
FIG. 2 depicts a simplified block diagram illustrating how the RSD component shown in FIG. 1A can be utilized as an addressable cross-point storage cell of an ReRAM crossbar array capable of incorporating aspects of the invention.

FIG. 2 depicts a simplified block diagram illustrating how the RSD storage cell 100 shown in FIG. 1A can be utilized as an addressable cross-point storage cell 100A of an ReRAM crossbar array 200 capable of incorporating aspects of the invention. The array 200 includes perpendicular conductive top electrode lines 202 (e.g., wordline rows), conductive bottom electrode lines 204 (e.g., bitline columns), and RSD memory cells 100A at the intersection between each top electrode line 202 and bottom electrode line 204. The storage cell 100A can be configured to operate the same as the storage cell 100 shown in FIG. 1A. Each storage cell 100A can be accessed for read and write by biasing the corresponding top electrode line 202 and bottom electrode line 204.

Figure 3:
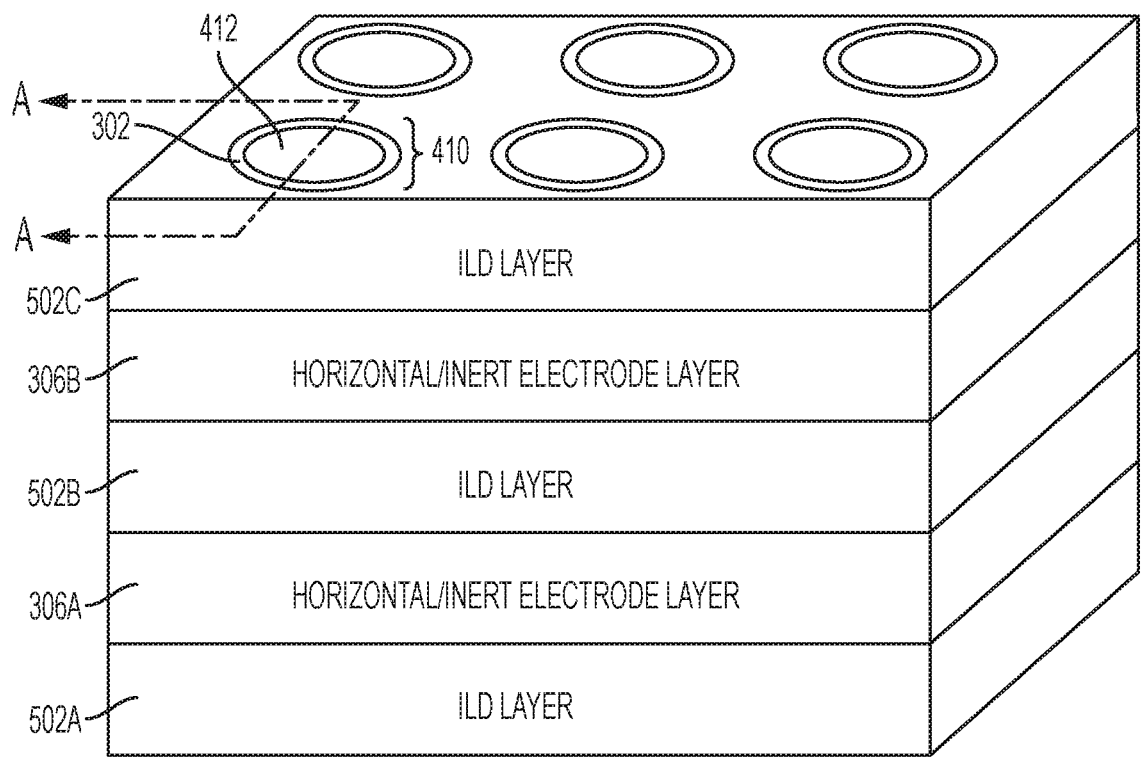
FIG. 3 depicts a simplified block diagram illustrating a vertical ReRAM array capable of incorporating aspects of the invention.

FIG. 3 depicts a simplified block diagram illustrating how RSD storage cells 100B, 100C (shown in FIG. 4) can be utilized as an addressable memory of a 3D vertical ReRAM array 300 capable of incorporating aspects of the invention. The RSD storage cells 100B, 100C include novel features in accordance with aspects of the invention but function, at a high level, substantially the same as the RSD storage cell 100 shown in FIG. 1A. The 3D vertical array 300 includes a stack formed from alternating layers of interlayer dielectrics (ILDs) 502D, 502E, 502F and horizontal plates/electrodes 306C, 306D. For ease of illustration and explanation, only two horizontal plates/electrodes 306C, 306D and three ILD layers 502D, 502E, 502F are shown in FIG. 3. However, aspects of the invention can be applied to a stack having any number of ILD layers and horizontal plates/electrodes. Multiple openings/vias 602 (shown in FIG. 6) having width dimensions 420 (shown in FIG. 6) extend through the stack, and multiple vertical electrodes 410 extend through each opening/via 602. For ease of illustration and explanation, only vertical electrodes 410 are shown in FIG. 3. However, aspects of the invention can be applied to a stack having any number of vertical electrodes 410 and openings/vias 602. In accordance with aspects of the invention, the metal oxides 304A, 304B (shown in FIG. 4) are not present within the openings/vias 602, but are instead formed as part of the horizontal plates 402A, 402B (shown in FIG. 4). Each storage cell 100B, 100C of the vertical ReRAM array 300 can be accessed for read and write by biasing the corresponding horizontal/inert electrode 306A and vertical electrode 410.

Figure 4:
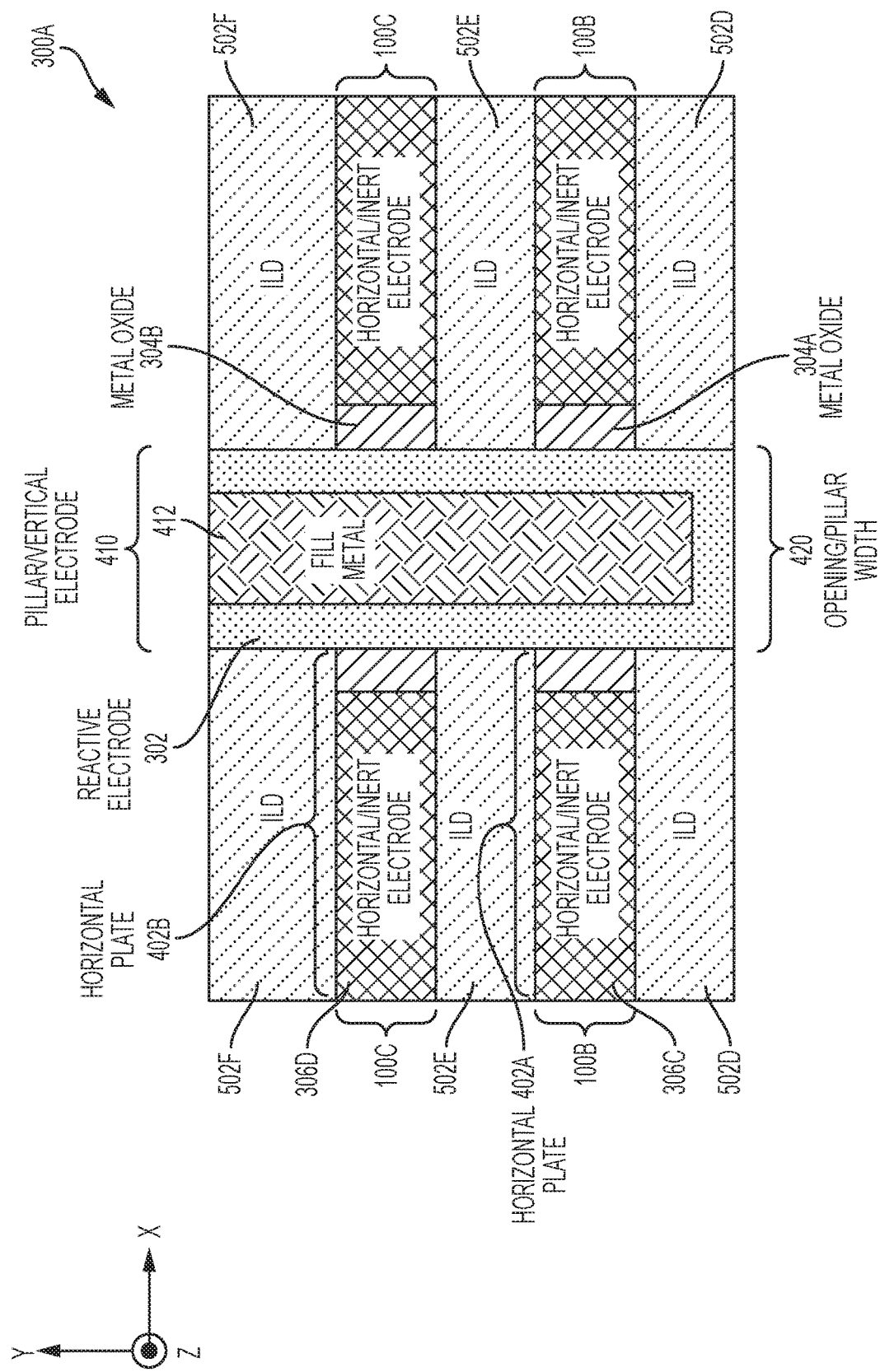
FIG. 4 depicts a cross-sectional view, taken along line A-A of FIG. 3, illustrating example RSDs of the vertical ReRAM array shown in FIG. 3.

FIG. 4 depicts a cross-sectional view, taken along line A-A in FIG. 3, of a portion 300A of the 3D vertical ReRAM array 300 (shown in FIG. 3). The 3D vertical ReRAM array 300A illustrates additional details of the RSD storage cells 100B, 100C. The vertical array 300A includes a first RSD 100B and a second RSD 100C. The first RSD 100B includes a horizontal inert electrode region 306C, a metal oxide region 304A, and the vertical electrode 410, configured and arranged as shown. The second RSD 100C includes a horizontal inert electrode region 306D, a metal oxide region 304B, and the vertical electrode 410, configured and arranged as shown. Functionally, the first and second RSDs 100B, 100C operate substantially the same as the two-terminal RSD component 100. For example, using the first RSD 100B as an example, when a sufficient electrical signal (e.g., a voltage) is applied across the top/bottom electrodes 410, 306D, the resistance of the metal oxide region 304A can be switched from one resistance state to another. The metal oxide region 104A retains its current resistance state until an appropriate electrical signal is applied across the top/bottom electrodes 410, 306A to change it. Interlayer dielectric (ILD) regions 502D, 502E, 502F are on opposite sides of each of the horizontal/inert electrodes 306C, 306D and the metal oxide regions 304A, 304B. The vertical electrode 410 includes a reactive electrode region 302, which can be formed from a stack of metal layers 302A, 302B, along with a metal fill region 412, which can be formed from a low resistivity metal 412A. The vertical electrode 410 is positioned within an opening/via 602C (shown in FIG. 9) and occupies the full volume (e.g., width dimension 420) of the opening 602C.

In accordance with aspects of the invention, a horizontal plate 402A of the first RSD 100B is formed from the horizontal/inert electrode 306C and the metal oxide region 304A, and a horizontal plate 402B of the second RSD 100C is formed from the horizontal/inert electrode 306D and the metal oxide region 304B. Accordingly, in contrast to known RSD/MIM configurations, the metal oxide regions 304A, 304B are fabricated in a manner such that they are, in effect, part of the horizontal plates 402A, 402B, respectively. Thus, in embodiments of the invention, the opening/via 602C (shown in FIG. 9) through the horizontal plates 402A, 402B extends, in effect, through the metal oxide regions 304A, 304B of the horizontal plates 402A, 402B. Accordingly, unlike known MIM configurations, none of the volume defined by the opening/via 602C needs to be allocated to the metal oxide regions 304A 304B, and all of the volume defined by the opening/via 602C through the horizontal plates 402A, 403B can be allocated to the vertical electrode 410. Although the metal oxide regions 304A, 304B are not present within the opening/via 602C, embodiments of the invention do not compromise the resistive switching performance of the first and second RSDs 100B, 100C because a full interface between the horizontal/inert electrodes 306C, 306D and the metal oxide regions 304A, 304B, respectively, is maintained. By maintaining the full horizontal-electrode/metal-oxide interface, the concentration of oxygen vacancies in the metal oxide regions 304A, 304B is not compromised.

In embodiments of the invention, the horizontal/inert electrodes 306C, 306D can each be formed from TiN or W deposited by ALD, chemical vapor deposition (CVD), or PVD. In an ALD application, $HfO_2$ or $Ta_2O_5$ or $ZrO_2$ can be used as base oxides to form the metal oxide regions 304A, 304B. The reactive electrode 302 of the vertical top electrode 410 can be formed by using ALD to form a TiN/(M)AlC/TiN stack, where M is a transition metal such as, but not limited to, Ti, Ta, and Nb. An oxygen vacancy concentration of the reactive electrode 302 of the vertical top electrode 410 can be controlled by the TiN/(M)AlC thicknesses and Al % in the (M)AlC layer of the reactive electrode 302.

In embodiments of the invention, the metal fill material 412 of the vertical electrode 410 can include one or more low-resistivity metals selected from the group consisting of tungsten (W), aluminum (Al), and copper (Cu). In embodiments of the invention, the reactive electrode region 302 can include a bottom layer, an intermediate layer and a top layer. The bottom layer can be formed from titanium nitride (TiN) having a thickness dimension from about 0.3 nm to about 3.0 nm. The intermediate layer can be formed from (M)AlC, where M is a transition metal selected from the group consisting of titanium (Ti), tantalum (Ta), and Niobium (Nb). The intermediate layer can have a thickness dimension from about 1 nm to about 10 nm. The top layer can be formed from TiN having a thickness dimension from about 1 nm to about 3 nm.

Figure 5:
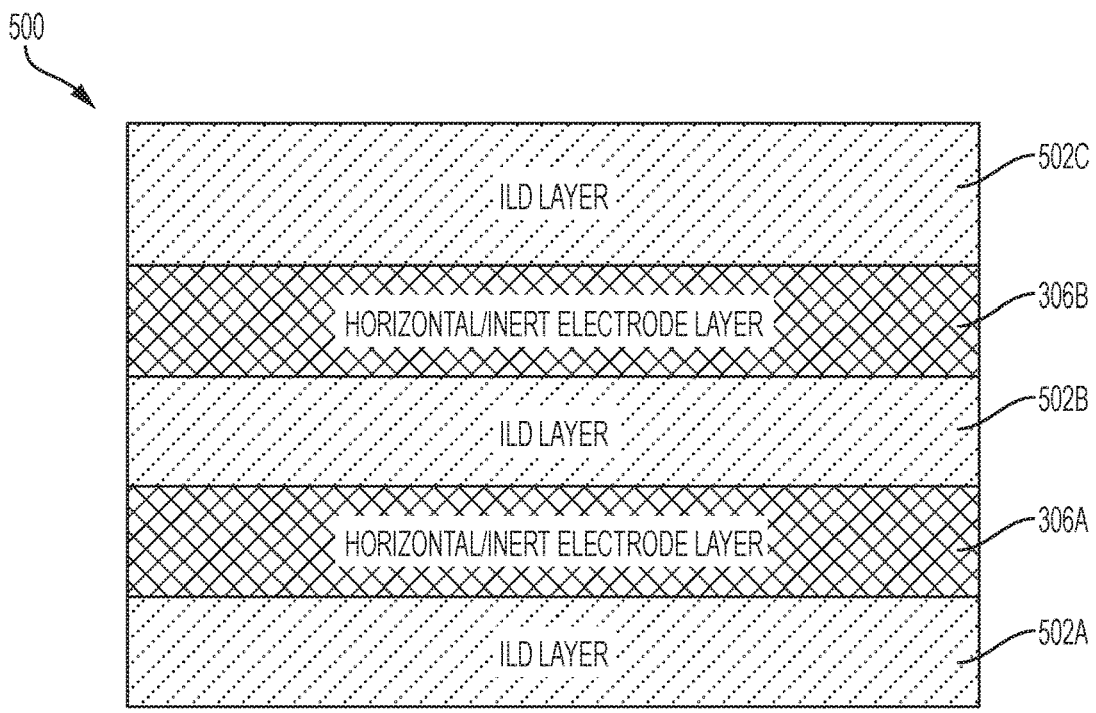

FIGS. 5-11 depict the results of various fabrication operations for forming the vertical ReRAM array 300A shown in FIG. 4. FIG. 5 depicts a cross-sectional view of an initial array structure 500 after an initial set of fabrication having been used to form alternating layers of an ILD layer 502A, a horizontal/inert electrode layer 306A, an ILD Layer 502B, a horizontal/inert electrode layer 306B, and an ILD Layer 502C, configured and arranged as show. A variety of known fabrication operations are suitable for forming the initial array structure 500 so the details of such operations have been omitted in the interest of brevity.

Figure 6:
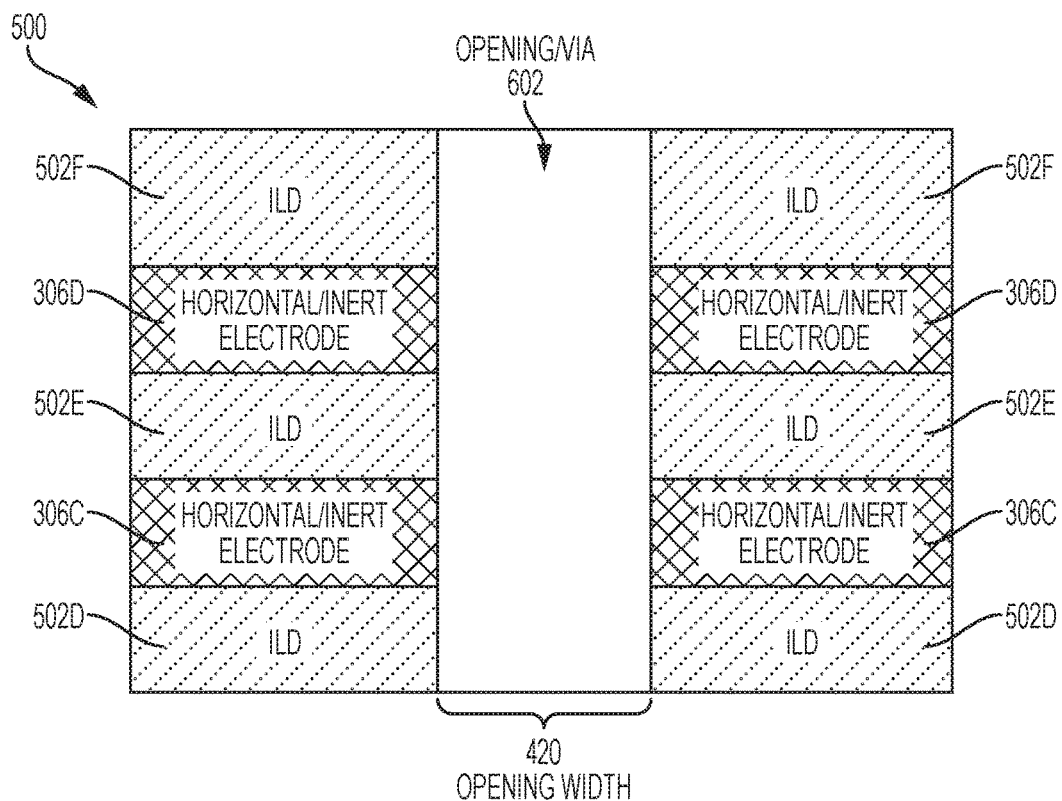

In FIG. 6, known fabrication operations (e.g., a reactive ion etch (RIE) has been used to form the opening/via 602 through the structure 500. The opening/via has width dimension 420. Forming the opening/via 602 results in the formation of ILD regions 502D, 502E, 502F and horizontal/inert electrode regions 306C, 306D.

Figure 7:
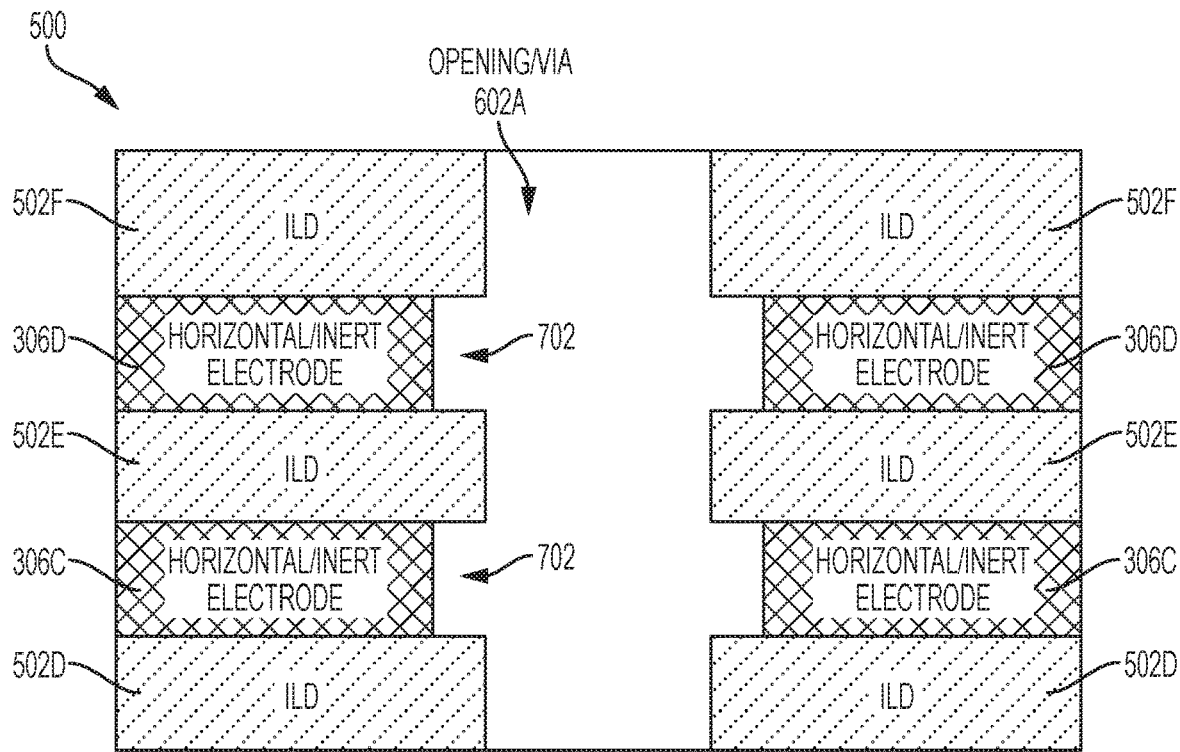

In FIG. 7, known fabrication operations (e.g., an isotropic RIE) have been used to selectively remove portions of the horizontal/inert electrode regions 306C, 306D to form undercut regions 702. The depth of the undercut regions 702 is selected to match the desired width of the metal oxide regions 304A, 304B (shown in FIG. 9) that will be formed therein. Forming the undercut regions 702 results in forming opening/via 602A having a serrated inner sidewall contour as shown in FIG. 7.

Figure 8:
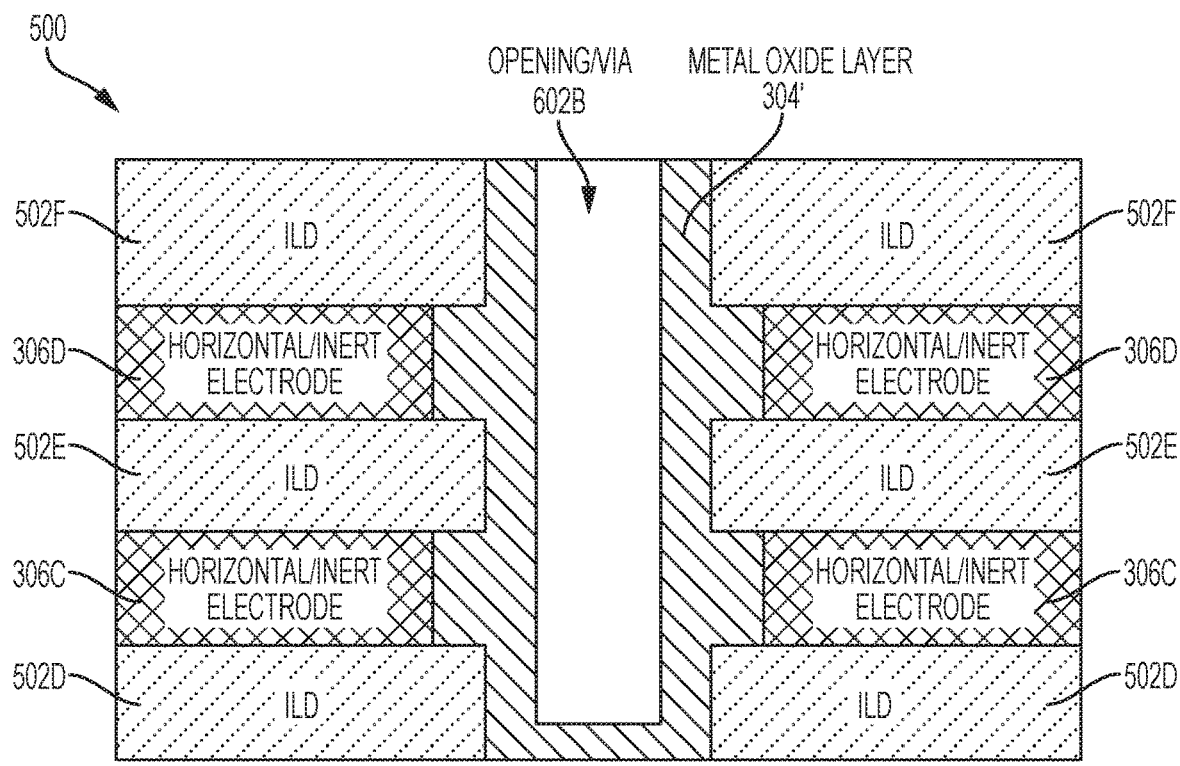

In FIG. 8, known fabrication operations (e.g., a conformal ALD) have been used to deposit a conformal metal oxide layer 304' such that the metal oxide layer 304' covers sidewalls of the opening/via 602A (shown in FIG. 7) and fills (or pinches off) in the undercut regions 702 (shown in FIG. 7). Depositing the metal oxide layer 304' results in forming an opening/via 602B.

Figure 9:
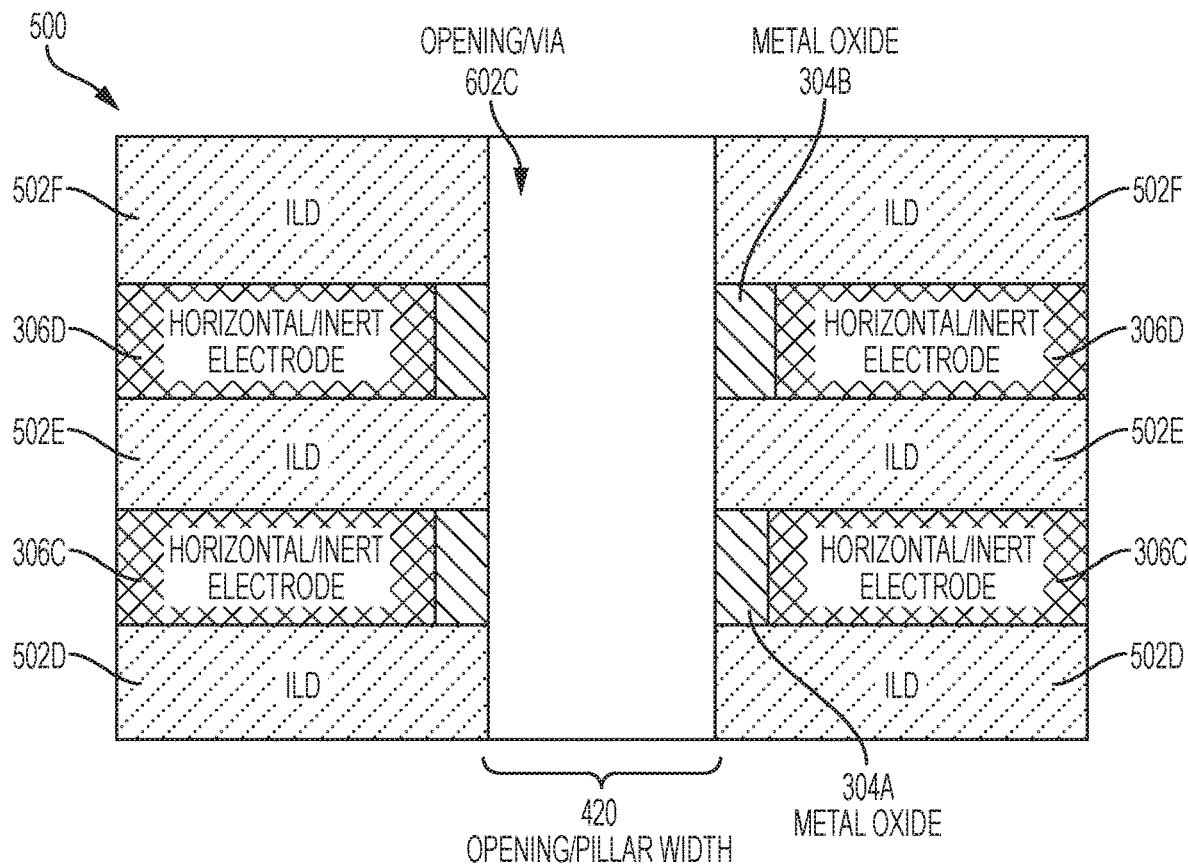

In FIG. 9, known fabrication operations (e.g., anisotropic RIE) have been used to selectively remove portions of the metal oxide layer 304' (shown in FIG. 8) to form the metal oxide regions 304A, 304B. Forming the metal oxide regions 304A, 304B results in forming an opening/via 602C, which has the same width 420 as the original opening/via 602 (shown in FIG. 6). The opening/via 602C has inner sidewalls defined by sidewalls of the ILD regions 502D, 502E, 502F and sidewalls of the metal oxide regions 304A, 304B.

Figure 10:
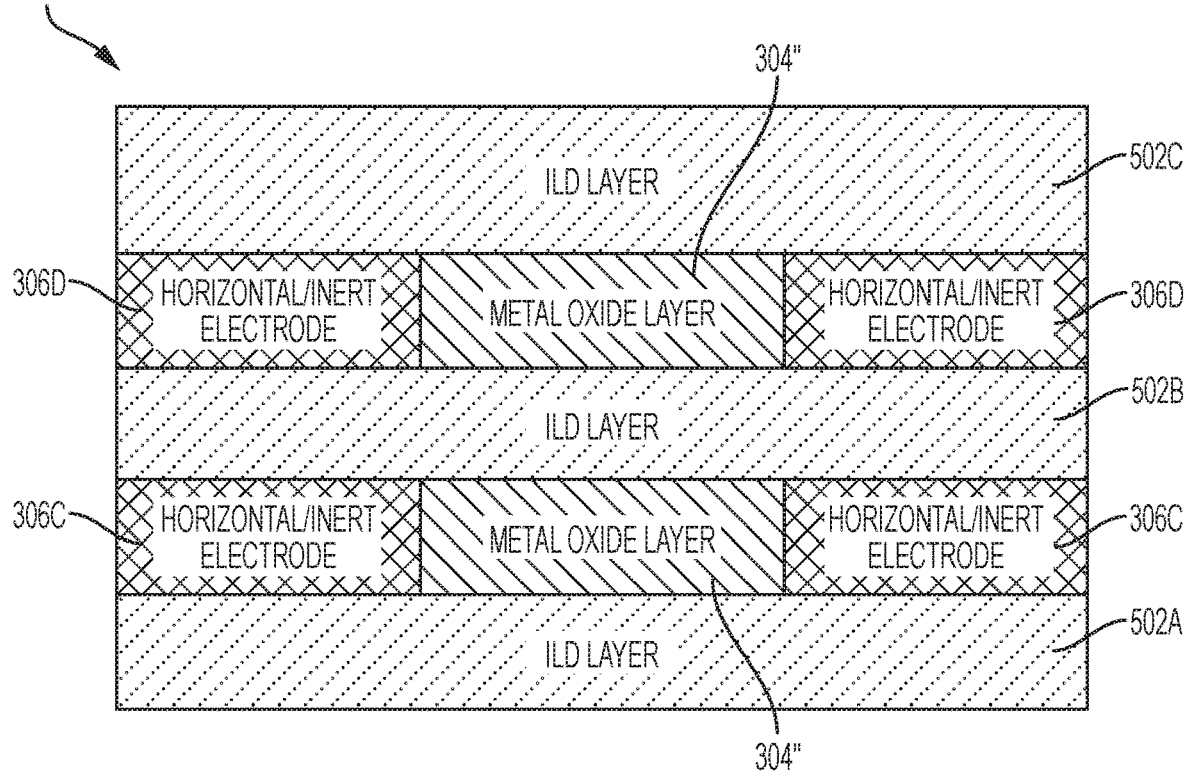

The fabrication stage of the array structure 500 shown in FIG. 9 can also formed from an array structure 1000 shown in FIG. 10. FIG. 10 depicts a cross-sectional view of the array structure 1000, which is an alternative to the initial array structure 500 shown in FIG. 5. As shown in FIG. 10, an initial set of fabrication having been used to form alternating layers of the ILD layer 502A, the horizontal/inert electrode layer 306C, a metal oxide layer 304'', the ILD Layer 502B, the horizontal/inert electrode layer 306D, a metal oxide layer 304''', and the ILD Layer 502C, configured and arranged as show. A variety of known fabrication operations are suitable for forming the array structure 1000 so the details of such operations have been omitted in the interest of brevity. Known fabrication operations (e.g., a reactive ion etch (RIE) can be applied to the array structure 1000 to form the opening/via 602C (shown in FIG. 9).

Figure 11:
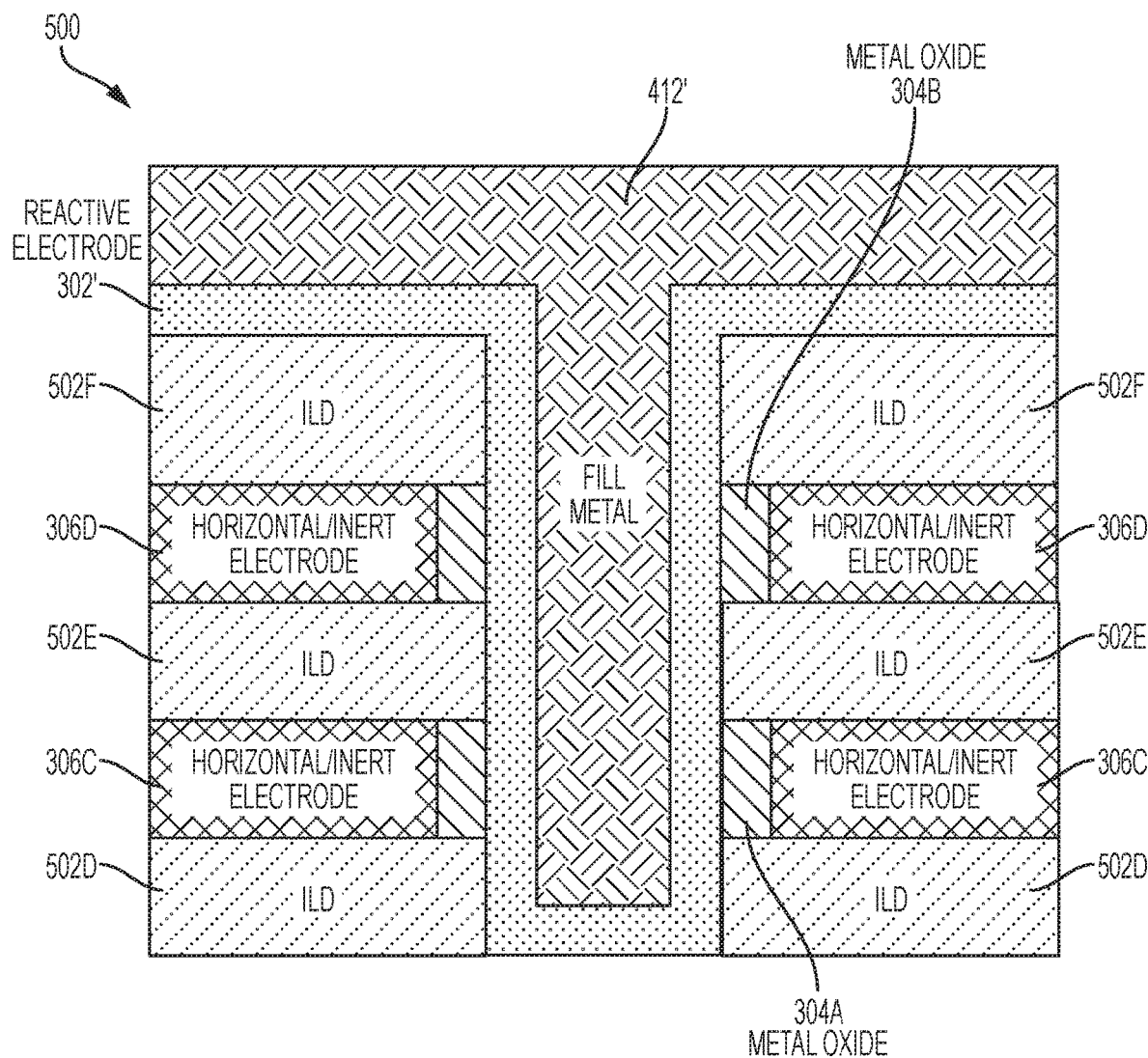

In FIG. 11, known fabrication operations (e.g., ALD, sputtering, etc.) have been used to deposit a reactive electrode material layer 302' across the structure 500 and into the opening/via 602C, and then deposit a fill metal material 412' across the structure 500 and into the remaining volume of the opening/via 602C. A chemical mechanical planarization (CMP) is applied to planarize the reactive electrode material 302' and the fill metal material 412' to form the vertical ReRAM array 300A shown in FIG. 4.

FIG. 12 depicts a table 1200 showing example ranges and material types for low resistivity, medium resistivity, and high resistivity according to aspects of the present invention. As shown in FIG. 12, a material can be considered to have low resistivity if its resistivity is below about $1 \times 10^6$ ohm meters. The electrical resistivity of a particular conductor material is a measure of how strongly the material opposes the flow of electric current through it. This resistivity factor, sometimes called its "specific electrical resistance," enables the resistance of different types of conductors to be compared to one another at a specified temperature according to their physical properties without regards to their lengths or cross-sectional areas. Thus, the higher the resistivity value of p the more resistance and vice versa. For example, the resistivity of a good conductor such as copper is on the order of $1.72 \times 10^{-8}$ ohm meters, whereas the resistivity of a poor conductor (insulator) such as air can be well over $1.5 \times 10^{14}$ ohm meters. Materials such as Cu and Al are known for their low levels of resistivity thus allowing electrical current to easily flow through them making these materials.

The vertical ReRAM array 300A (shown in FIG. 4) can be fabricated in the back end of line (BEOL) at relatively low temperatures, which allows for easy integration with CMOS devices and stacking in 3D. Accordingly, vertical ReRAM array can be used not only for NVM, but also for computing memories, thereby allowing fast data access to overcome the bottlenecks that can occur in conventional von Neumann computing architectures, as well as for computing architectures blurring the distinction between memory circuits and computing circuits, such as nonvolatile memristive logic computation or neuromorphic networks (e.g., ANNs).

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A vertical resistive device comprising:
a horizontal plate comprising a conductive electrode region and a filament region;
an opening extending through the filament region and defined by sidewalls of the filament region, wherein the filament region is positioned outside of the opening; and
a conductive pillar positioned within the opening and communicatively coupled to the filament region;
wherein the conductive electrode region functions as a bottom electrode of a resistive switching device (RSD);
wherein the filament region functions as an insulator region of the RSD;
wherein the conductive pillar functions as a top electrode of the RSD; and
wherein an oxygen vacancy concentration of the RSD is controlled by:
a thickness of a plurality of metals forming the top electrode; and
a percentage of one of the plurality of metals forming the top electrode.

2. The device of claim 1 further comprising:
a first dielectric layer across from the conductive electrode region and the filament region of the horizontal plate; and
a second dielectric layer on an opposite side the horizontal plate than the first dielectric layer and positioned across from the conductive electrode region and the filament region of the horizontal plate;
wherein the opening also extends through the first dielectric layer and the second dielectric layer;
wherein sidewalls of the opening are also defined by sidewalls of the first dielectric layer and sidewalls of the second dielectric layer.

3. The device of claim 2, wherein the filament region is bound by the horizontal plate, the first dielectric layer, the second dielectric layer, and the conductive pillar.

4. The device of claim 1, wherein:
the pillar comprises a cylindrical shape; and
the filament region comprises a ring shape and extends around the pillar.

5. A vertical resistive device comprising:
a horizontal plate comprising a conductive electrode region and a filament region;
an opening extending through the filament region and defined by sidewalls of the filament region, wherein the filament region is positioned outside of the opening; and
a conductive pillar positioned within the opening and communicatively coupled to the filament region;
wherein the conductive pillar comprises a reactive electrode and a metal fill material;
wherein the reactive electrode comprises:
a bottom layer comprising titanium nitride (TiN) and having a thickness dimension from about 0.3 nm to about 3.0 nm;
an intermediate layer comprising (M)AlC, where M is a transition metal selected from the group consisting of titanium (Ti), tantalum (Ta), and Niobium (Nb), wherein the intermediate layer comprises a thickness dimension from about 1 nm to about 10 nm; and
a top layer comprising TiN and having a thickness dimension from about 1 nm to about 3 nm.

6. The device of claim 1, wherein the metal fill material comprises one or more low-resistivity metals selected from the group consisting of tungsten (W), aluminum (Al), and copper (Cu).

7. The device of claim 1, wherein the horizontal plate comprise titanium nitride (TiN) or tungsten (W).

8. The device of claim 2, wherein the first dielectric layer and the second dielectric layer comprise silicon nitride (SiN) or silicon dioxide ($SiO_2$).

9. The device of claim 1, wherein the filament region comprises a metal oxide comprising a compound selected from the group consisting of $HfO_2$ or $Ta_2O_5$ or $ZrO_2$.

10. A method of forming a vertical resistive device, the method comprising:
forming a stack comprising:
a horizontal plate comprising a conductive electrode region and a filament region;
an opening extending through the filament region and defined by sidewalls of the filament region, wherein the filament region is positioned outside of the opening; and
a conductive pillar positioned within the opening and communicatively coupled to the filament region;
wherein the conductive electrode region functions as a bottom electrode of a resistive switching device (RSD);
wherein the filament region functions as an insulator region of the RSD;
wherein the conductive pillar functions as a top electrode of the RSD; and
controlling an oxygen vacancy concentration of the RSD by:
controlling a thickness of a plurality of metals forming the top electrode; and
controlling a percentage of one of the plurality of metals forming the top electrode.

11. The method of claim 10, wherein:
forming the stack further comprises:
forming a first dielectric layer across from the conductive electrode region and the filament region of the horizontal plate; and forming a second dielectric layer on an opposite side the horizontal plate than the first dielectric layer and positioned across from the conductive electrode region and the filament region of the horizontal plate;

wherein the opening also extends through the first dielectric layer and the second dielectric layer; and wherein sidewalls of the opening are also defined by sidewalls of the first dielectric layer and sidewalls of the second dielectric layer.

12. The method of claim 11, wherein the filament region is formed such that the filament region is bound by the horizontal plate, the first dielectric layer, the second dielectric layer, and the conductive pillar.

13. The method of claim 10, wherein:

the conductive pillar is formed such that the conductive pillar comprises a reactive electrode and a metal fill material;

the reactive electrode is formed such that the reactive electrode comprises:

a bottom layer comprising titanium nitride (TiN) and having a thickness dimension from about 0.3 nm to about 3.0 nm;

an intermediate layer comprising (M)AlC, where M is a transition metal selected from the group consisting of titanium (Ti), tantalum (Ta), and Niobium (Nb), wherein the intermediate layer comprises a thickness dimension from about 1 nm to about 10 nm; and a top layer comprising TiN and having a thickness dimension from about 1 nm to about 3 nm; and the fill material is formed such that the metal fill material comprises one or more low-resistivity metals selected from the group consisting of tungsten (W), aluminum (Al), and copper (Cu).

14. The method of claim 11 further comprising:

forming the horizontal plate to comprise titanium nitride (TiN) or tungsten (W);

forming the first dielectric layer and the second dielectric layer to comprise silicon nitride (SiN) or silicon dioxide ($SiO_2$); and forming the filament region to comprise a metal oxide comprising a compound selected from the group consisting of $HfO_2$ or $Ta_2O_5$ or $ZrO_2$.

* * * * *